US012813042B2

(12) United States Patent
Tseng et al.

(10) Patent No.: US 12,813,042 B2

(45) Date of Patent: Nov. 24, 2026

(54) ELECTRONIC DEVICE

(71) Applicant: Innolux Corporation, Miaoli County (TW)

(72) Inventors: Chia-Ping Tseng, Miaoli County (TW); Chia-Chi Ho, Miaoli County (TW)

(73) Assignee: Innolux Corporation, Miaoli County (TW)

(*) Notice: Subject to any disclaimer, the term of this patent is extended or adjusted under 35 U.S.C. 154(b) by 606 days.

(21) Appl. No.: 17/991,779

(22) Filed: Nov. 21, 2022

(65) Prior Publication Data

US 2023/0187594 A1 Jun. 15, 2023

Related U.S. Application Data

(60) Provisional application No. 63/287,536, filed on Dec. 9, 2021.

(30) Foreign Application Priority Data

Aug. 15, 2022 (CN) ......................... 202210976960.6

(51) Int. Cl.

*H10H 20/857* (2025.01)

*H10H 20/854* (2025.01)

(52) U.S. Cl.

CPC ........ *H10H 20/857* (2025.01); *H10H 20/854* (2025.01)

(58) Field of Classification Search

CPC ....... H10H 20/857; H01L 24/11; H01L 24/13; H01L 25/167; H05K 1/181; H05K 2201/0338; H05K 2201/0367; H05K 2201/099; H05K 2201/10106; H05K 2201/10166

See application file for complete search history.

(56) References Cited

U.S. PATENT DOCUMENTS 10,430,000 B2 10/2019 Wu et al.
10,992,022 B2 4/2021 Khan et al.

(Continued)

FOREIGN PATENT DOCUMENTS

CN 101919043 6/2013
TW 201032310 9/2010

OTHER PUBLICATIONS

"Search Report of Europe Counterpart Application", issued on May 12, 2023, pp. 1-13.

(Continued)

*Primary Examiner* — Nicholas J Tobergte
*Assistant Examiner* — Hamna Fathima Iqbal
(74) *Attorney, Agent, or Firm* — JCIPRNET

(57) ABSTRACT

The disclosure provides an electronic device including a substrate, at least one conductive composite structure, and an electronic element. The at least one conductive composite structure is disposed on the substrate. The at least one conductive composite structure includes a first metal layer, a second metal layer, and a third metal layer. The second metal layer is located between the first metal layer and the third metal layer, and the thickness of the second metal layer ranges from 0.5 μm to 12 μm. The electronic element is disposed on the at least one conductive composite structure and bonded to the at least one conductive composite structure.

17 Claims, 9 Drawing Sheets

(56) References Cited

U.S. PATENT DOCUMENTS

| | | | | |
|---|---|---|---|---|
| 2004/0247840 | A1* | 12/2004 | Sugiura | H10W 72/20 428/210 |
| 2009/0020322 | A1* | 1/2009 | Hsu | H05K 3/3473 174/257 |
| 2009/0314650 | A1* | 12/2009 | Tseng | H05K 1/0206 205/205 |
| 2013/0277099 | A1* | 10/2013 | Wu | H05K 1/0221 174/266 |
| 2020/0013686 | A1* | 1/2020 | Kao | H10D 86/441 |
| 2021/0149259 | A1* | 5/2021 | Onaka | G09F 9/30 |
| 2021/0227691 | A1* | 7/2021 | Yugawa | H05K 1/09 |
| 2021/0249399 | A1 | 8/2021 | Chen et al. | |
| 2021/0255506 | A1* | 8/2021 | Wu | G02F 1/1323 |
| 2021/0327861 | A1* | 10/2021 | Chen | H10W 90/00 |

OTHER PUBLICATIONS

"Office Action of Taiwan Counterpart Application", issued on Jan. 16, 2026, p. 1-p. 5.

* cited by examiner

ELECTRONIC DEVICE

CROSS-REFERENCE TO RELATED APPLICATION

This application claims the priority benefit of U.S. provisional application Ser. No. 63/287,536, filed on Dec. 9, 2021, and China application serial no. 202210976960.6, filed on Aug. 15, 2022. The entirety of each of the above-mentioned patent applications is hereby incorporated by reference herein and made a part of this specification.

BACKGROUND

Technical Field

The disclosure relates to an electronic device, and more particularly, to an electronic device with favorable structural reliability.

Description of Related Art

It is well known that the copper area on the ground plane of the carrier board of the antenna device accounts for more than 85% and is easily subjected to warpage. The warpage is generated due to poor adhesion between the metal copper layer and the dielectric layer of the insulating layer resulting from the difference of thermal expansion coefficients between the metal copper layer and the dielectric layer of the insulating layer (e.g., silicon nitride) after being processed, which further affects the overall structural reliability.

SUMMARY

The disclosure is directed to an electronic device with favorable structural reliability.

According to an embodiment of the disclosure, an electronic device includes a substrate, at least one conductive composite structure, and an electronic element. The at least one conductive composite structure is disposed on the substrate. The at least one conductive composite structure includes a first metal layer, a second metal layer, and a third metal layer. The second metal layer is located between the first metal layer and the third metal layer, and the thickness of the second metal layer ranges from 0.5 μm to 12 μm. The electronic element is disposed on the at least one conductive composite structure and bonded to the at least one conductive composite structure.

In summary, in the embodiments of the disclosure, the conductive composite structure disposed on the substrate is composed of the first metal layer, the second metal layer, and the third metal layer. The thickness of the second metal layer located between the first metal layer and the third metal layer ranges from 0.5 μm to 12 μm.

In order to make the features and advantages of the disclosure comprehensible, embodiments accompanied with drawings are described in detail below.

BRIEF DESCRIPTION OF THE DRAWING

Accompanying drawings are included to provide a further understanding of the disclosure and incorporated in the specification as a part thereof. The drawings illustrate embodiments of the disclosure and together with the specification serve to explain the principles of the disclosure.

DESCRIPTION OF THE EMBODIMENTS

Figure 1:
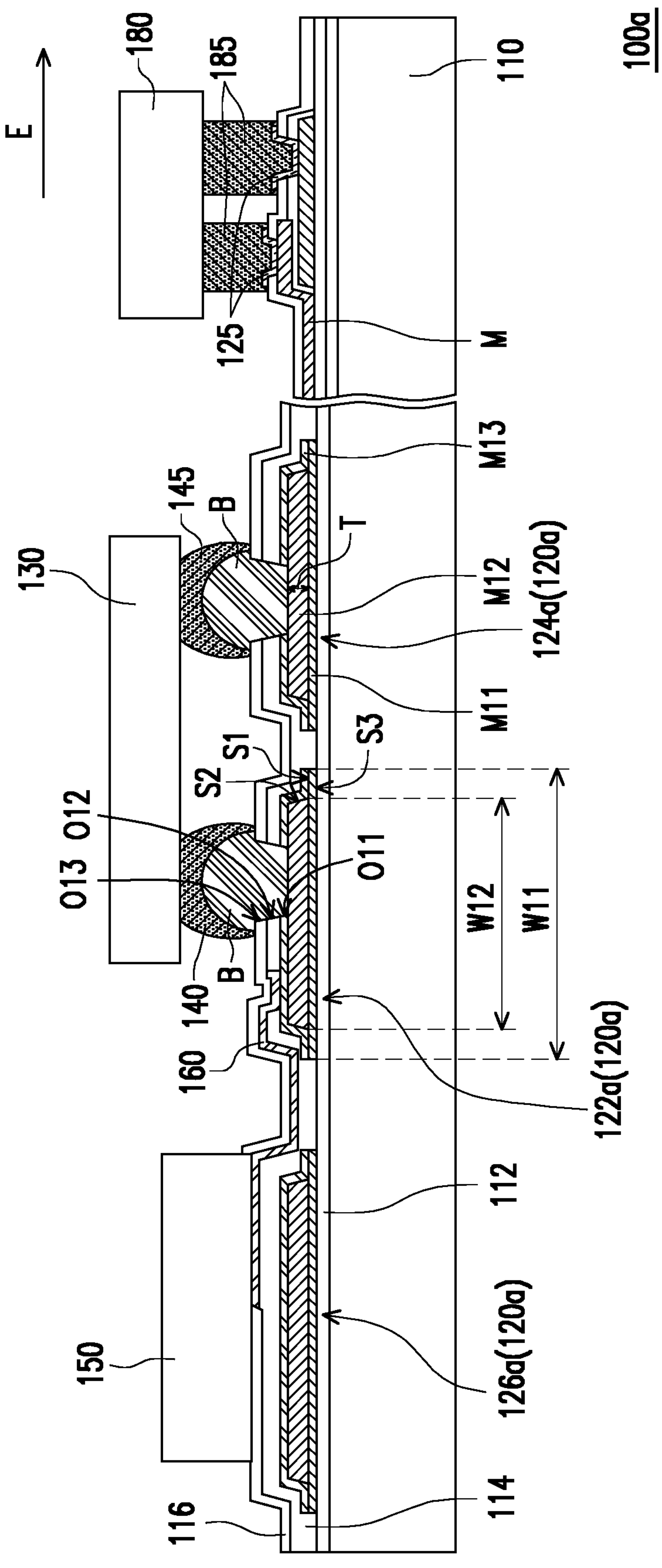
FIG. 1 is a schematic cross-sectional view of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific elements in the drawings are not necessarily drawn to scale. Moreover, the quantity and the size of each element in the drawings are only schematic and are not intended to limit the scope of the disclosure.

Throughout the specification and the appended claims of the disclosure, certain terms are used to refer to specific elements. Those skilled in the art should understand that electronic device manufacturers may probably use different names to refer to the same elements. This specification is not intended to distinguish between elements that have the same function but different names.

In the following specification and claims, the terms "including", "containing", "having", etc., are open-ended terms, so they should be interpreted to mean "including but not limited to . . . ".

In addition, relative terms, such as "lower" or "bottom" and "upper" or "top", may be used in the embodiments to describe a relative relationship between one element and another element of the drawings. It may be understood that if the device in the drawings is turned upside down, the elements described on the "lower" side shall become the elements on the "upper" side.

In some embodiments of the disclosure, terms such as "connect" and "interconnect" with respect to bonding and connection, unless specifically defined, may refer to two structures that are in direct contact (in indirect contact) with each other, or may refer to two structures that are indirectly in contact with each other, wherein there are other structures set between these two structures. In addition, the terms that describe joining and connecting may apply to the case where both structures are movable or both structures are fixed. In addition, the term "coupling" involves the transfer of energy between two structures by means of direct or indirect electrical connection, or the transfer of energy between two separate structures by means of mutual induction.

It should be understood that when a element or a film layer is described as being "on" or "connected to" another element or film layer, it may be directly on or connected to the another element or film layer, or there is an intervening element or film layer therebetween (an indirect situation). When an element is described as being "directly on" or "directly connected" to another element or film layer, there is no intervening element or film layer therebetween.

The terms such as "about", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range.

As the used herein, the terms "film" and/or "layer" may refer to any continuous or discontinuous structures and materials (e.g., materials deposited by the methods disclosed herein). For example, films and/or layers may include two-dimensional materials, three-dimensional materials, nanoparticles, or even partial or complete molecular layers, or partial or complete atomic layers, or clusters of atoms and/or molecules. The film or layer may include a material or layer having pinholes, which may be at least partially continuous.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

Unless otherwise defined, all terms (including technical and scientific terms) used herein have the same meaning as commonly understood by people skilled in the art to which the disclosure pertains. It is understood that these terms, such as those defined in commonly used dictionaries, should be interpreted as having meanings consistent with the relevant art and the background or context of the disclosure, and should not be interpreted in an idealized or overly formal manner unless otherwise defined in the embodiments of the disclosure.

In the disclosure, the features of multiple embodiments to be described below may be replaced, recombined, or mixed to form other embodiments without departing from the spirit of the disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

FIG. 1 is a schematic cross-sectional view of an electronic device according to an embodiment of the disclosure. In the embodiment, an electronic device 100*a* includes a substrate 110, at least one conductive composite structure 120*a*, and an electronic element 130. The at least one conductive composite structure 120*a* is disposed on the substrate. The at least one conductive composite structure 120*a* includes a first metal layer M11, a second metal layer M12, and a third metal layer M13. The second metal layer M12 is located between the first metal layer M11 and the third metal layer M13, and a thickness T of the second metal layer M12 ranges from 0.5 μm to 12 μm (0.5 μm≤thickness T≤12 μm). The electronic element 130 is disposed on the at least one conductive composite structure 120*a* and bonded to the at least one conductive composite structure 120*a*.

In detail, the electronic device 100*a* of the disclosure may include a display device, an antenna device, a sensing device, a light-emitting device, or a splicing device, but the disclosure is not limited thereto. The electronic device 100*a* may include a bendable or flexible electronic device. The electronic device 100*a* includes a liquid crystal layer or alight emitting diode (LED), for example. The electronic device 100*a* may include the electronic element 130. The electronic element 130 may include passive elements, active elements, integrated circuits or a combination thereof, such as capacitors, resistors, inductors, variable capacitors, filters, diodes, transistors, inductors, MEMS, liquid crystal chips, and the like, but the disclosure is not limited thereto. The diodes may include light emitting diodes or photodiodes. The light emitting diodes may, for example, include organic light emitting diodes (OLEDs), mini LEDs, micro LEDs, quantum dot LEDs, fluorescence, phosphorescence or other suitable materials, or a combination thereof, but the disclosure is not limited thereto. The variable capacitors may include antenna element, but the disclosure is not limited thereto. The sensors may include, for example, capacitive sensors, optical sensors, electromagnetic sensors, fingerprint sensors (FPS), touch sensors, antennas, or pen sensors, and the like, but the disclosure is not limited thereto.

Furthermore, the at least one conductive composite structure 120*a* in the embodiment includes a first conductive composite structure 122*a* and a second conductive composite structure 124*a*, and the first conductive composite structure 122*a* and the second conductive composite structure 124*a* are disposed at intervals. The at least one conductive composite structure 120*a* may further include a third conductive composite structure 126*a*. The first conductive composite structure 122*a* is located between the second conductive composite structure 124*a* and the third conductive composite structure 126*a*. The first conductive composite structure 122*a*, the second conductive composite structure 124*a*, and the third conductive composite structure 126*a* are disposed apart from one another in a discontinuous manner. In one embodiment, the horizontal distance between the first conductive composite structure 122*a* and the second conductive composite structure 124*a* and the horizontal distance between the first conductive composite structure 122*a* and the third conductive composite structure 126*a* for example, range from 10 μm to 100 μm (10 μm≤horizontal distance≤100 μm), but the disclosure is not limited thereto. In some embodiments, each of the first conductive composite structure 122*a*, the second conductive composite structure 124*a* and the third conductive composite structure 126*a* is composed of the first metal layer M11, the second metal layer M12, and the third metal layer M13, but the disclosure is not limited thereto.

The material of the third metal layer M13 may have corrosion resistance and may be well compatible with the material of the second metal layer M12. In one embodiment, the material of the first metal layer M11 and the material of the third metal layer M13 may include, for example, titanium, titanium alloy, molybdenum, molybdenum alloys (e.g., molybdenum-titanium alloys, molybdenum-tantalum alloys, molybdenum-niobium alloys, and the like), indium tin oxide (ITO) or indium zinc oxide (IZO). The material can be selected according to different etch processes, the material of the second metal layer M12 can be, for example, copper or aluminum, but the disclosure is not limited thereto. In one embodiment, one of the first metal layer M11 and the third metal layer M13 can be made of oxide, which can improve the adhesion with an adjacent insulating layer 114 and can protect the second metal layer M12. The thickness of the first metal layer M11 is, for example, 10 nm to 0.5 μm. The thickness of the third metal layer M13 is, for example, 10 nm to 0.5 μm, but can be regarded as a protective layer. In the manufacturing process, the second metal layer M12 and the first metal layer M11 may be etched through an etching process, and then a third metal layer M13 covering a side surface S2 of the second metal layer M12 and an upper surface S1 of the first metal layer M11 is formed.

Furthermore, in the embodiment, a width W11 of the first metal layer M11 is greater than a width W12 of the second metal layer M12. Meanwhile, the width refers to the maximum width along the extending direction E parallel to the substrate 110. The third metal layer M13 is at least partially in contact with the side surface S2 of the second metal layer M12. Meanwhile, the third metal layer M13 completely covers and is in contact with the side surface S2 of the second metal layer M12, and part of a lower surface S3 of the third metal layer M13 is in contact with part of the upper surface S1 of the first metal layer M11. That is, the second metal layer M12 is completely encapsulated by the lower surface of the third metal layer M13 and the upper surface of the first metal layer M11. In one embodiment, when the thickness T of the second metal layer M12 is thick enough, such as more than 1 μm, electromagnetic waves cannot pass therethrough.

As shown in FIG. 1, an insulating layer 112, the insulating layer 114, and an insulating layer 116 are further disposed on the substrate 110 of the embodiment, the insulating layer 112 is located between the substrate 110 and the first metal layer M11 and in direct contact with the substrate 110, the insulating layer 114 covers the conductive composite structure 120*a*, and the insulating layer 116 covers the insulating layer 114. Meanwhile, the third metal layer M13 has an opening O11 exposing part of the second metal layer M12, the insulating layer 114 has an opening O12, and the insulating layer 116 has an opening O13. The opening O13 connects with the opening O12 and the opening O11. The inner wall of the opening O13, the inner wall of the opening O12, and the inner wall of the opening O11 are continuous inclined planes, forming an inverted trapezoidal cross-sectional shape. The width of the upper end of the opening O11 is substantially equal to the width of the lower end of the opening O12. A bump B is adapted for being disposed in the opening O11, the opening O12, and the opening O13 and extending to cover part of the insulating layer 116, where the bump B is electrically connected to the third metal layer M13 and the second metal layer M12.

In one embodiment, the materials of the insulating layer 112, the insulating layer 114 and the insulating layer 116 can be, for example, silicon nitride, silicon oxide, epoxy resin, silicon material, or a combination thereof, but the disclosure is not limited thereto. In one embodiment, if the material of the first metal layer M11 is titanium, the first metal layer M11 and the insulating layer 112 and the insulating layer 114 of silicon nitride have good film adhesion. Accordingly, the difference in thermal expansion coefficient between the second metal layer M12 and the insulating layer 112 and the insulating layer 114 of silicon nitride can be buffered, and the problem of adhesion peeling between the second metal layer M12 and the insulating layer 112 and the insulating layer 114 of silicon nitride can be effectively improved. In addition, the sandwich-type composite structure 120*a* also reduces pin holes generated by the deposition of the silicon nitride passivation layer, which can subsequently reduce the risk of copper corrosion in the post-process.

Referring to FIG. 1 again, the electronic element 130 of the embodiment can be illustrated by an antenna or a light emitting diode, which is correspondingly disposed above the first conductive composite structure 122*a* and the second conductive composite structure 124*a*. In the embodiment, the electronic device 100*a* further includes a first solder 140 and a second solder 145 disposed between the electronic element 130 and the substrate 110. The electronic element 130 is electrically connected to the first conductive composite structure 122*a* through the first solder 140 and to the second conductive composite structure 124*a* through the second solder 145. Meanwhile, the first solder 140 and the second solder 145 are each bonded on the bump B, and the electronic element 130 is electrically connected to the bump B and the conductive composite structure 120*a* through the solder (including the first solder 140 and the second solder 145).

In addition, referring to FIG. 1 again, in the embodiment, the electronic device 100*a* further includes a switching element 150 and a redistribution layer 160. The switching element 150 is disposed on the substrate 110 corresponding to the third conductive composite structure 126*a*. The redistribution layer 160 is disposed on the substrate 110 and on the insulating layer 114, and the switching element 150 is electrically connected to the first conductive composite structure 122*a* through the redistribution layer 160. In one embodiment, the switching element 150 may include a chip or a package. In one embodiment, the switching element 150 may include a thin film transistor (TFT) element, a metal oxide semiconductor field effect transistor (MOSFET) element, or an integrated circuit, such as packaged and bonded chips or packages on a chip-on-board (COB) through surface mounting technology (SMT).

In addition, the electronic device 100*a* of the embodiment further includes a circuit board 180 and an anisotropic conductive adhesive 185. A circuit board 180*g* and the anisotropic conductive adhesive 185 are disposed on the substrate 110, and the circuit board 180*g* is electrically connected to the metal layer M on the substrate 110 through the anisotropic conductive adhesive 185 and the metal intermediate layer 125. The circuit board 180 may be, for example, a chip on film (COF) or a chip on glass (COG). The metal intermediate layer 125 can be selected from materials with corrosion resistance and oxidation resistance and can be used as a conduction structure with the out lead bonding (OLB) area. In one embodiment, the area of all metal layers (including the first metal layer M11, the second metal layer M12, the third metal layer M13, the metal layer M, etc.) accounts for 0.3 times or more the area of the substrate 110.

In short, in the embodiment of the disclosure, the conductive composite structure 120*a* disposed on the substrate 110 includes the first metal layer M11, the second metal layer M12, and the third metal layer M13. The thickness of the second metal layer M12 located between the first metal layer M11 and the third metal layer M13 ranges from 0.5 μm to 12 μm. That is, the thicker second metal layer M12 and the substrate 110 are separated from the first metal layer M11, thereby effectively reducing the warpage of the second metal layer M12 resulting from the difference in thermal expansion coefficient between the second metal layer M12 and the substrate 110. Accordingly, the electronic device 100*a* of the disclosure can have favorable structural reliability.

Meanwhile, note that the following embodiments use the reference numerals and part of the contents of the previous embodiments, the same reference numerals are used to represent the same or similar elements, and the description of the same technical contents is omitted. For the description of the omitted part, refer to the foregoing embodiments, which is not repeated in the following embodiments.

Figure 2:
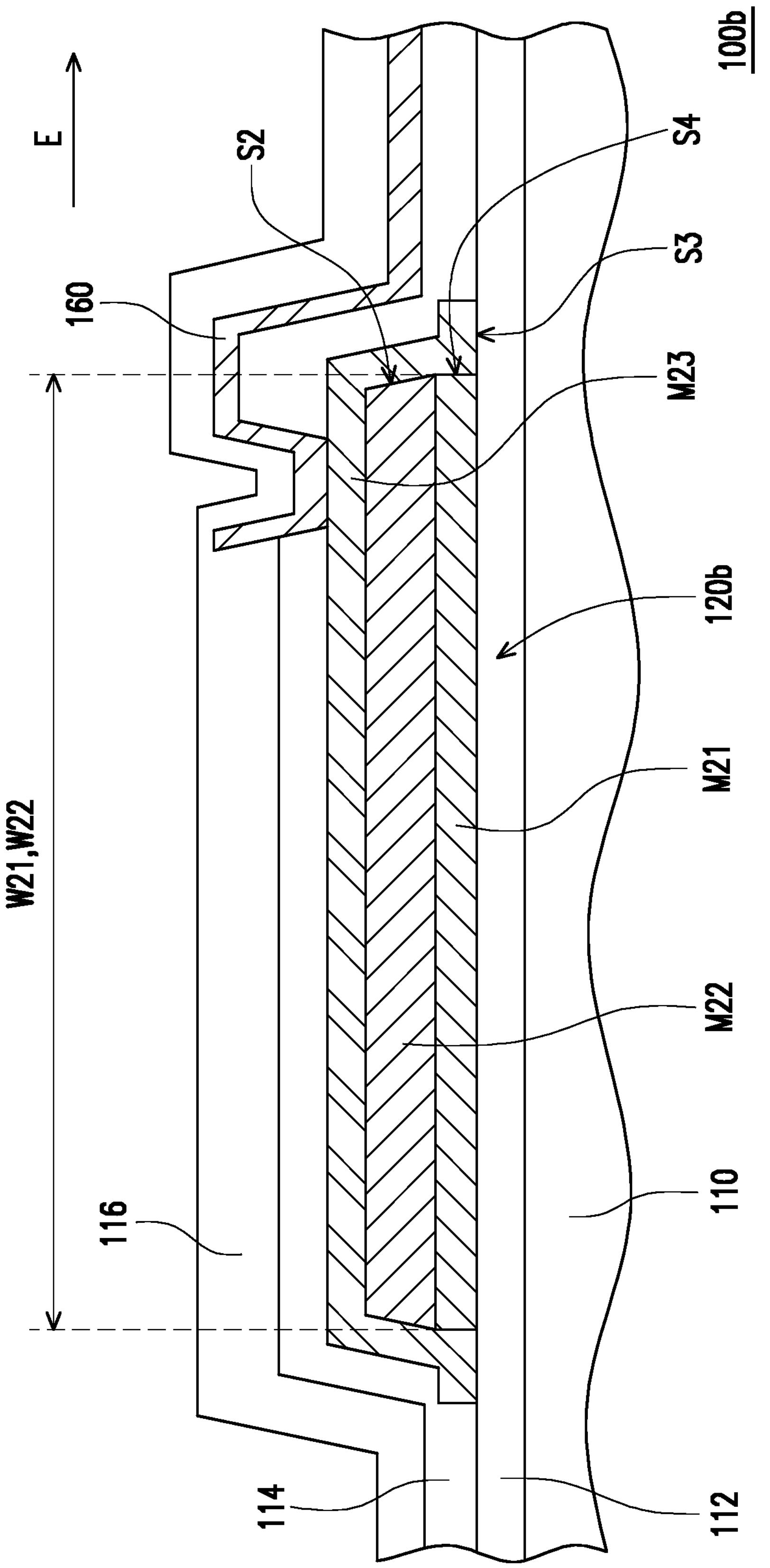
FIG. 2 is a partial cross-sectional schematic view of an electronic device according to another embodiment of the disclosure.

FIG. 2 is a partial cross-sectional schematic view of an electronic device according to another embodiment of the disclosure. Referring to FIG. 2, in an electronic device 100*b* of the embodiment, in a conductive composite structure 120*b*, a width W21 of a first metal layer M21 may be equal to a width W22 of a second metal layer M22. Part of the lower surface S3 of a third metal layer M23 is in contact with a side surface S4 of the first metal layer M21. The lower surface S3 of the third metal layer M23 is in direct contact with the insulating layer 112 and the side surface S2 of the first metal layer M21, and the second metal layer M22 and the first metal layer M21 are encapsulated therein. In one embodiment, the third metal layer M23 is not in contact with the substrate 110 but has a distance from the substrate 110 and covers the side surface S2 of the second metal layer M22 and part of the side surface S4 of the first metal layer M21.

Figure 3:
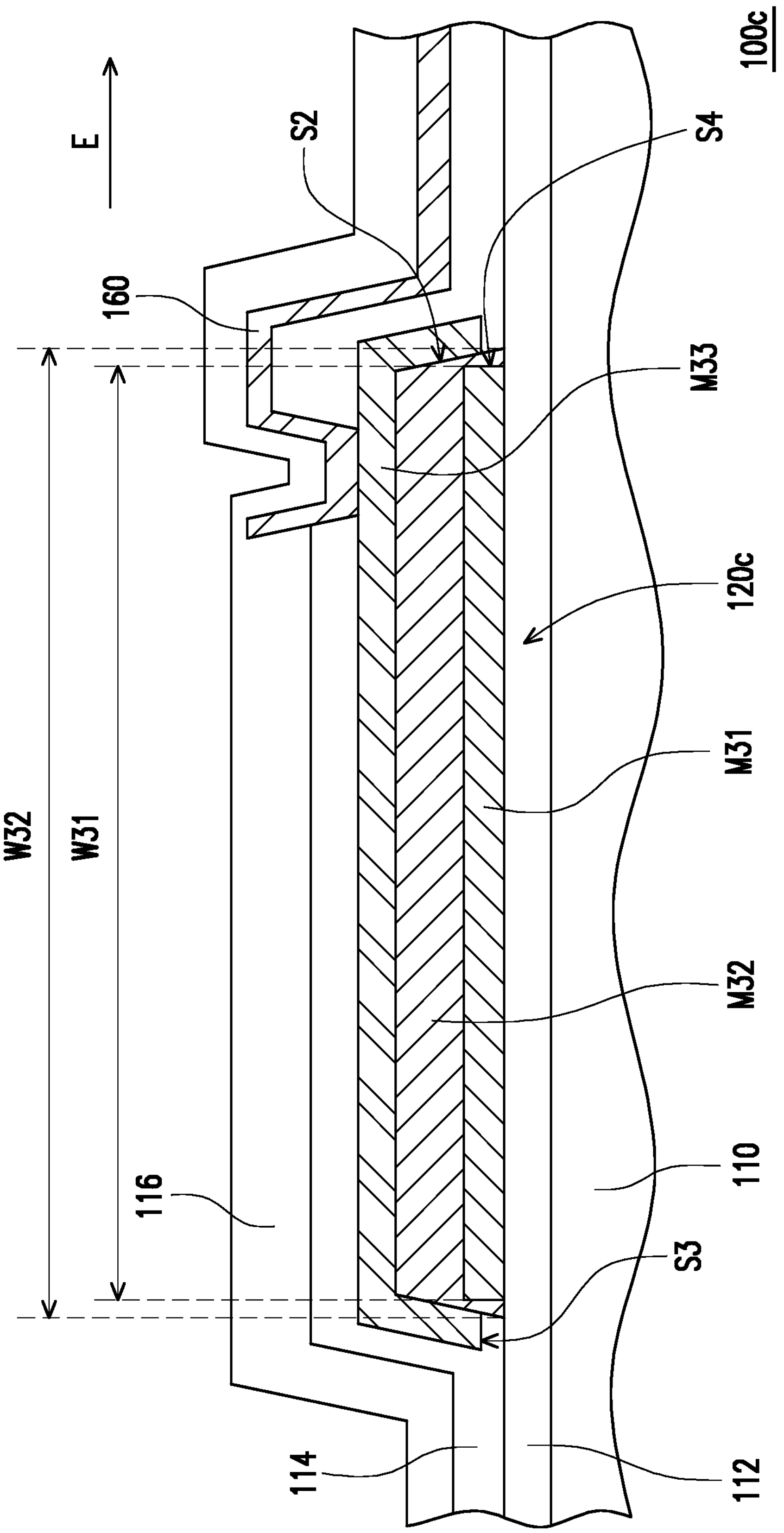
FIG. 3 is a partial cross-sectional schematic view of an electronic device according to another embodiment of the disclosure.

FIG. 3 is a partial cross-sectional schematic view of an electronic device according to another embodiment of the disclosure. Referring to FIG. 3, in an electronic device 100*c* of the embodiment, a width W31 of a first metal layer M31 of a conductive composite structure 120*c* is less than a width W32 of a second metal layer M32. A third metal layer M33 is not in contact with the first metal layer M31, and the second metal layer M32 is in contact with the side surface S4 of the first metal layer M31.

Figure 4:
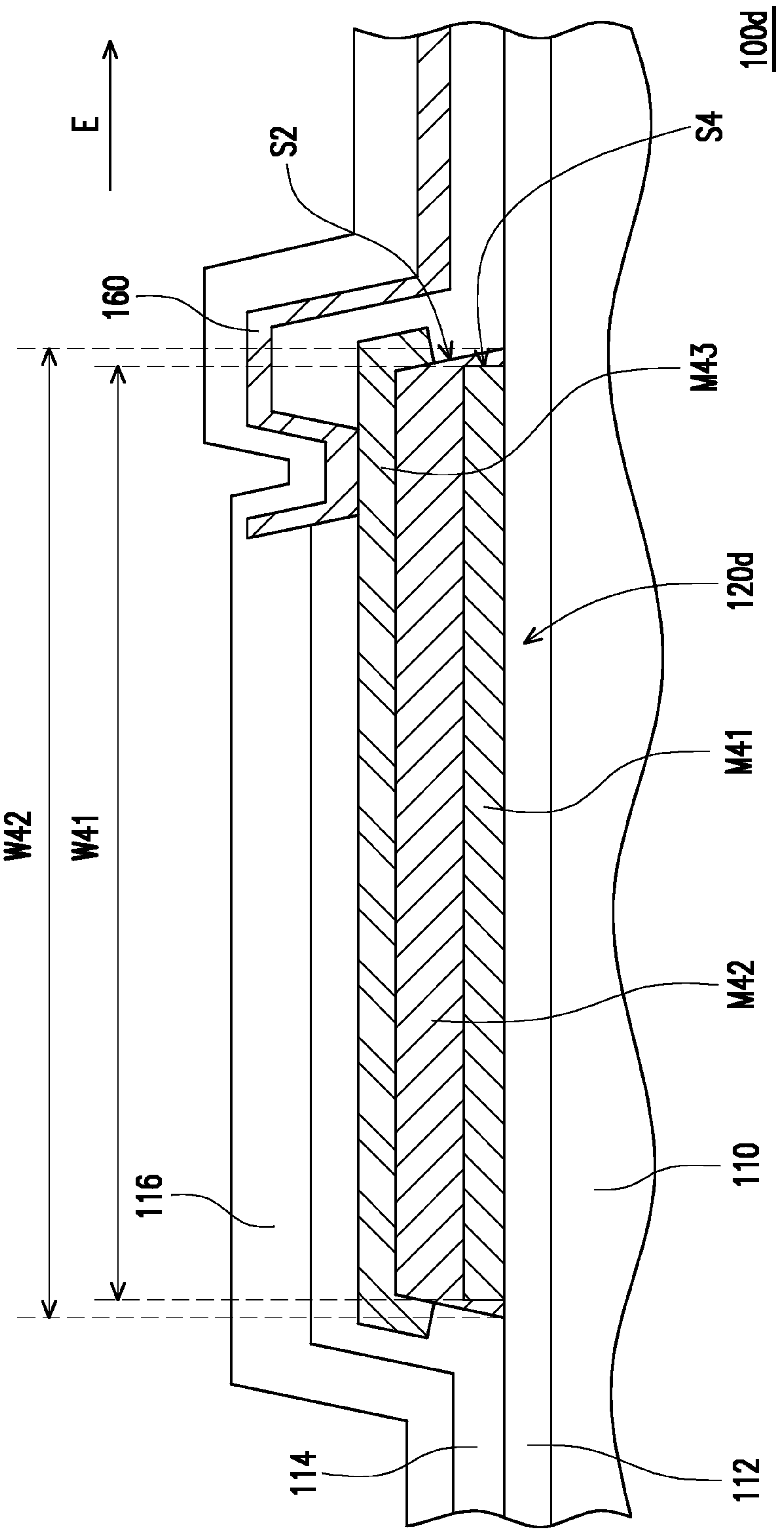
FIG. 4 is a partial cross-sectional schematic view of an electronic device according to another embodiment of the disclosure.

FIG. 4 is a partial cross-sectional schematic view of an electronic device according to another embodiment of the disclosure. Referring to FIG. 4, in an electronic device 100*d* of the embodiment, a width W41 of a first metal layer M41 of the conductive composite structure 120*d* is less than or equal to a width W42 of the second metal layer M42. Part of the third metal layer M43 is in contact with the side surface S2 of the second metal layer M42. The second metal layer M42 is in contact with the side surface S4 of the first metal layer M41.

Figure 5:
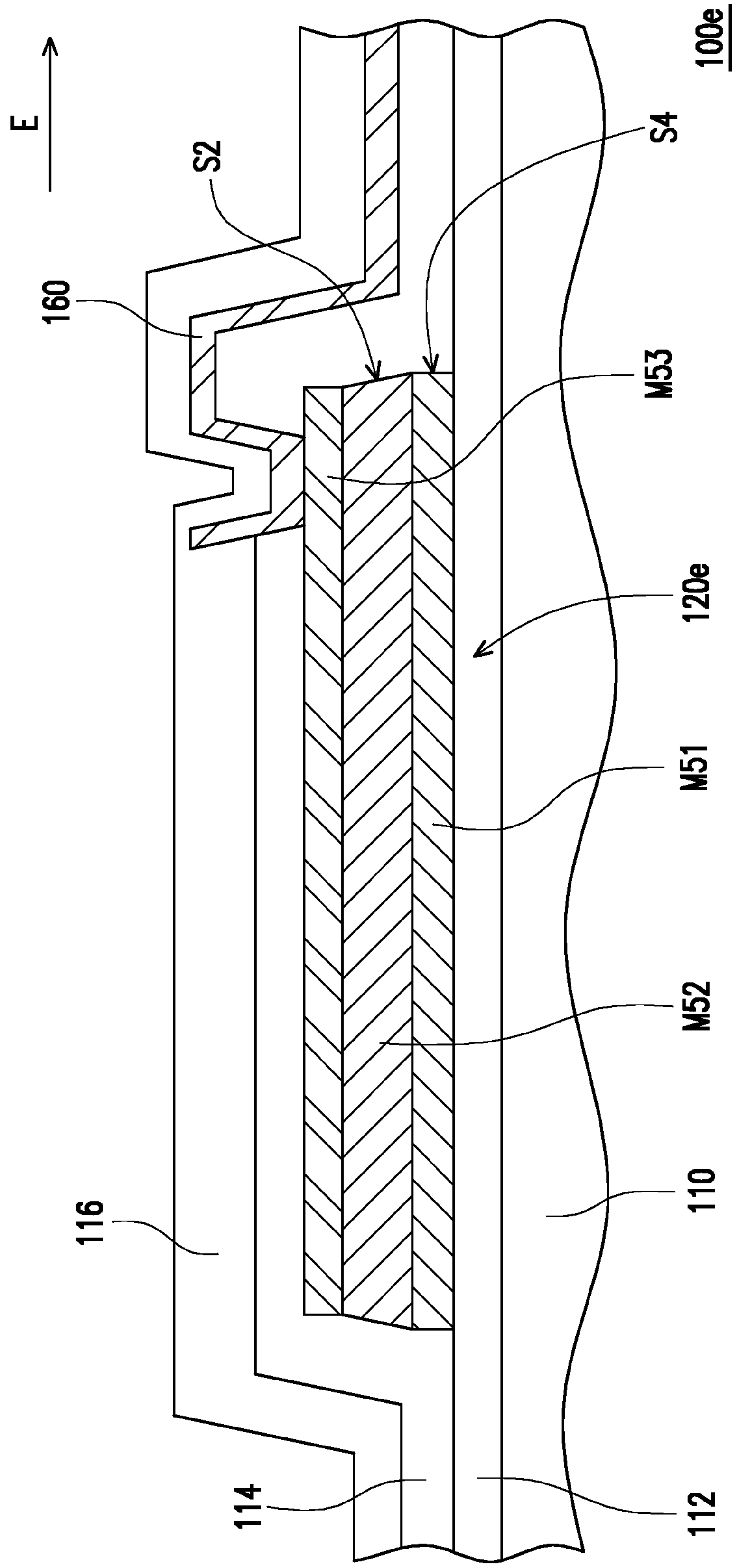
FIG. 5 is a partial cross-sectional schematic view of an electronic device according to another embodiment of the disclosure.

FIG. 5 is a partial cross-sectional schematic view of an electronic device according to another embodiment of the disclosure. Referring to FIG. 5, in an electronic device 100*e* of the embodiment, the third metal layer M53 of the conductive composite structure 120*e* is not in contact with the side surface S2 of the second metal layer M52 nor in contact with the side surface S4 of the first metal layer M51.

Figure 6:
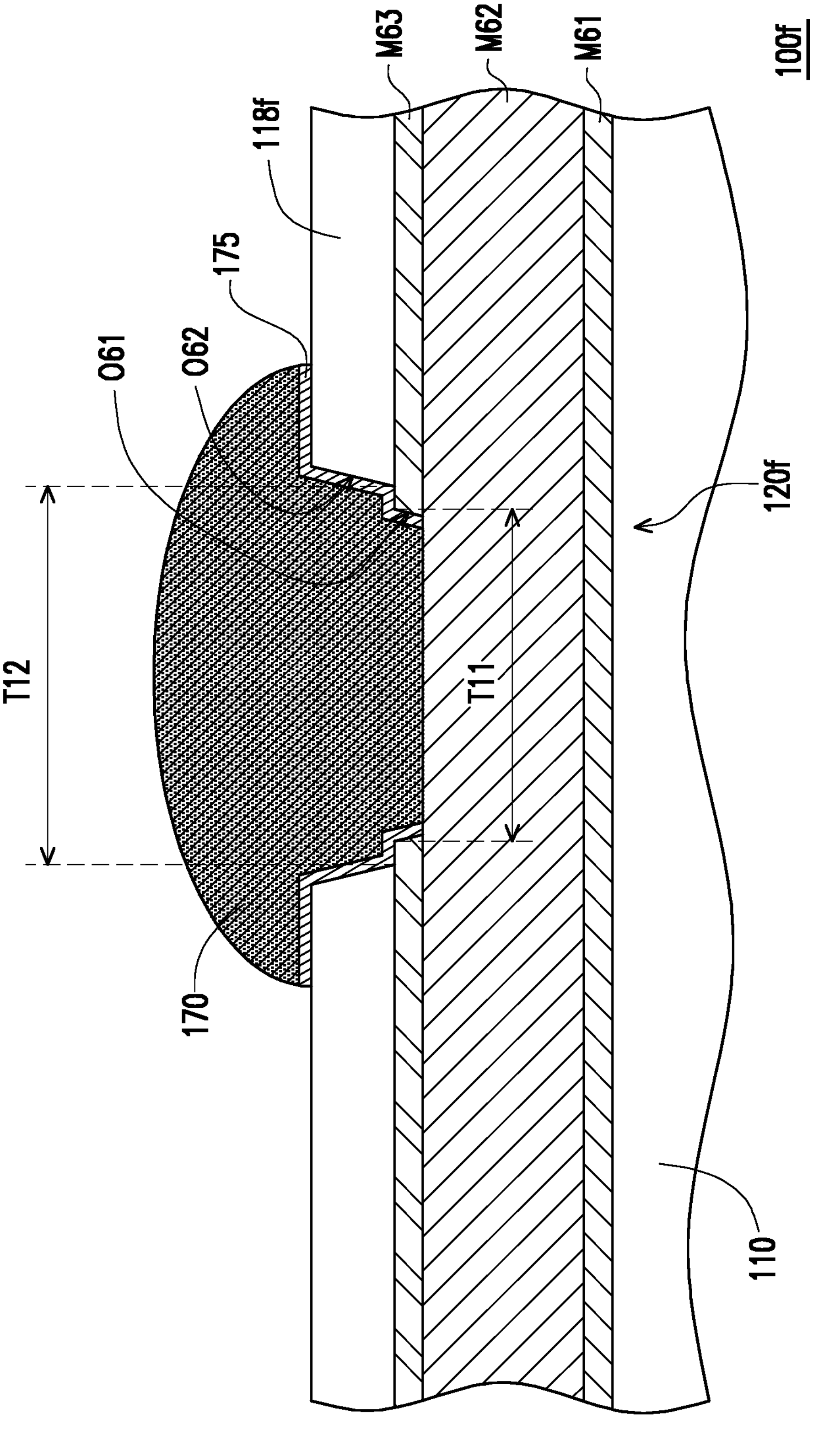
FIG. 6 is a partial cross-sectional schematic view of an electronic device according to another embodiment of the disclosure.

FIG. 6 is a partial cross-sectional schematic view of an electronic device according to another embodiment of the disclosure. Referring to FIG. 6, in an electronic device 100*f* of the embodiment, a conductive composite structure 120*f* includes a first metal layer M61, a second metal layer M62, and a third metal layer M63. The third metal layer M63 has a first opening O61, and an insulating layer 118*f* on the third metal layer M63 has a second opening O62. The first opening O61 exposes part of the second metal layer M62. The electronic device 100*f* in the embodiment further includes a surface treatment layer 175 disposed on the inner wall of the first opening O61 and the inner wall of the second opening O62 and extending to part of the insulating layer 118*f*. A solder 170 is filled in the first opening O61 and the second opening O62 and electrically connected to the conductive composite structure 120*f*. Meanwhile, a width T12 of the lower end of the second opening O62 is greater than a width T11 of the upper end of the first opening O61. The solder 170 is not in direct contact with the insulating layer 118*f* and the third metal layer M63. The solder 170 may form a eutectic bond with the surface treatment layer 175.

During the manufacturing process, the first opening O61 and the second opening O62 may be formed by dry etching the third metal layer M63 and the insulating layer 118*f*. Next, an electroless nickel immersion gold (ENIG) process is performed, the desired surface treatment layer 175 is formed on the inner wall of the first opening O61 and the inner wall of the second opening O62 and extends to part of the insulating layer 118*f*. Finally, the solder 170 is filled in the first opening O61 and the second opening O62.

Figure 7:
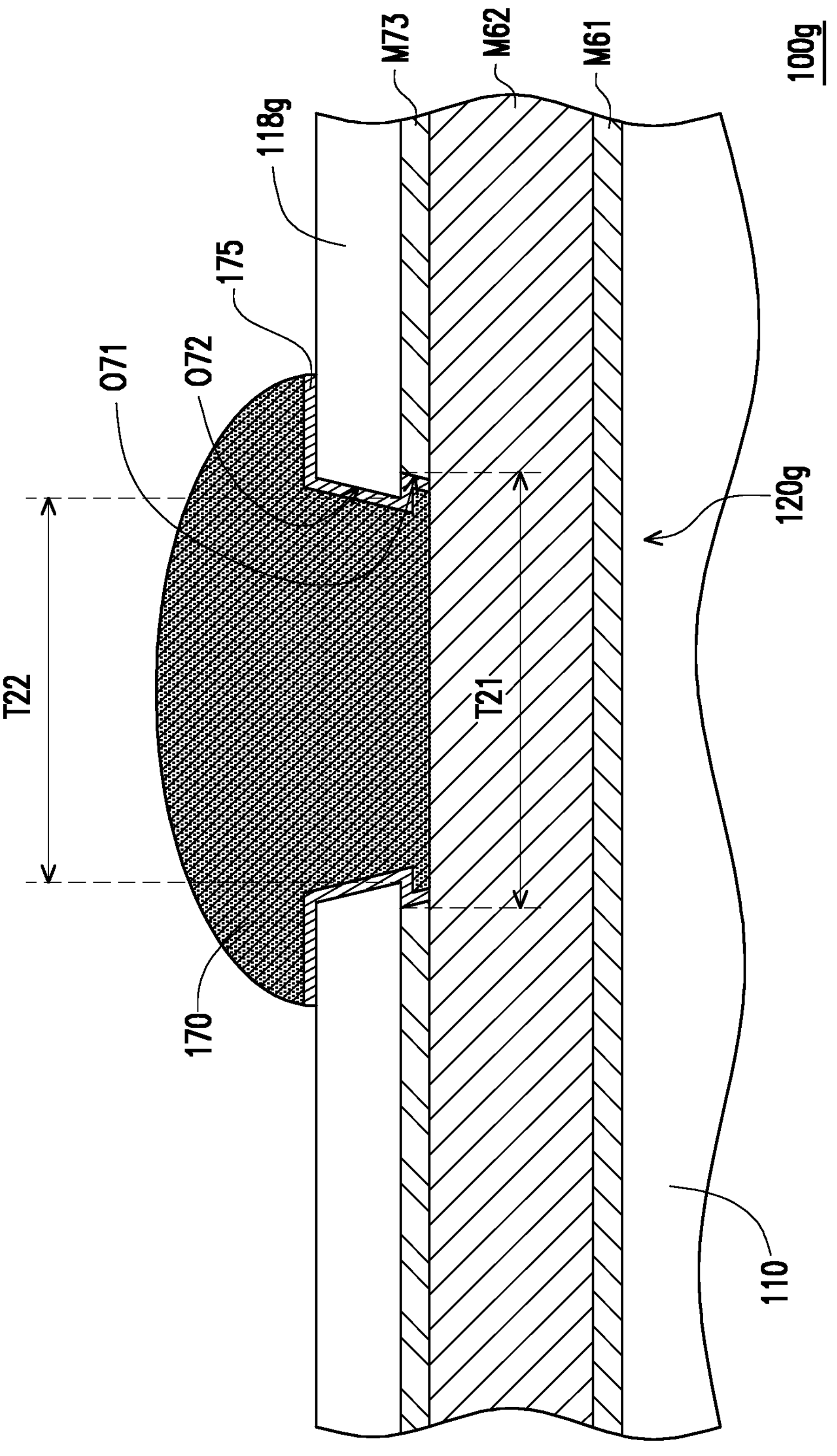
FIG. 7 is a partial cross-sectional schematic view of an electronic device according to another embodiment of the disclosure.

FIG. 7 is a partial cross-sectional schematic view of an electronic device according to another embodiment of the disclosure. Referring to FIG. 7, in an electronic device 100*g* of the embodiment, a third metal layer M73 of a conductive composite structure 120*g* has a first opening O71, and an insulating layer 118*g* on the third metal layer M73 has a second opening O72. The first opening O71 exposes part of the second metal layer M62. The solder 170 is filled in the first opening O71 and the second opening O72 and electrically connected to the conductive composite structure 120*g*. A width T22 of the lower end of the second opening O72 is less than a width T21 of the upper end of the first opening O71.

Figure 8:
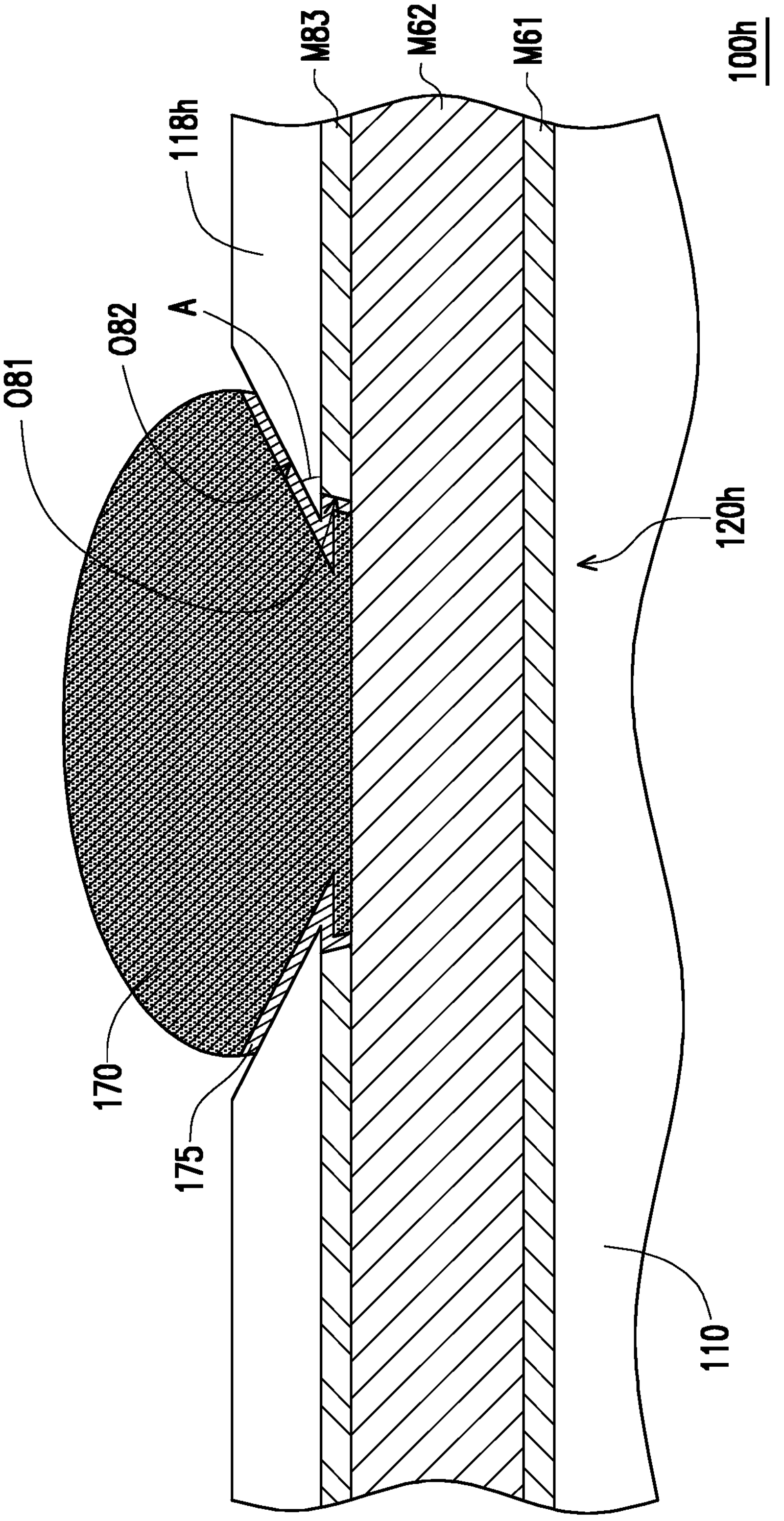
FIG. 8 is a partial cross-sectional schematic view of an electronic device according to another embodiment of the disclosure.

FIG. 8 is a partial cross-sectional schematic view of an electronic device according to another embodiment of the disclosure. Referring to FIG. 8, in an electronic device 100*h* of the embodiment, a third metal layer M83 of a conductive composite structure 120*h* has a first opening O81, and an insulating layer 118*h* on the third metal layer M83 has a second opening O82. The first opening O81 exposes part of the second metal layer M62. The solder 170 is filled in the first opening O81 and the second opening O82 and electrically connected to the conductive composite structure 120*h*. An angle A between the second opening O82 and the bottom surface of the insulating layer 118*h* ranges from, for example, 20° to 90° (20°≤the angle A≤90°), which can reduce the stress when the solder 170 is filled. In some embodiments, the angle A can also be, for example, 30°, 40°, 50°, 60°, 70°, or 80°, but the disclosure is not limited thereto. In one embodiment, the thickness of the insulating layer 118*f* is, for example, 0.5 μm to 2 μm (0.5 μm≤thickness≤2 μm), for example, 1.5 μm. In one embodiment, the maximum diameter of the second opening O82 is, for example, 3 μm to 6 μm (3 μm≤maximum diameter≤6 μm), for example, 5 μm.

Figure 9:
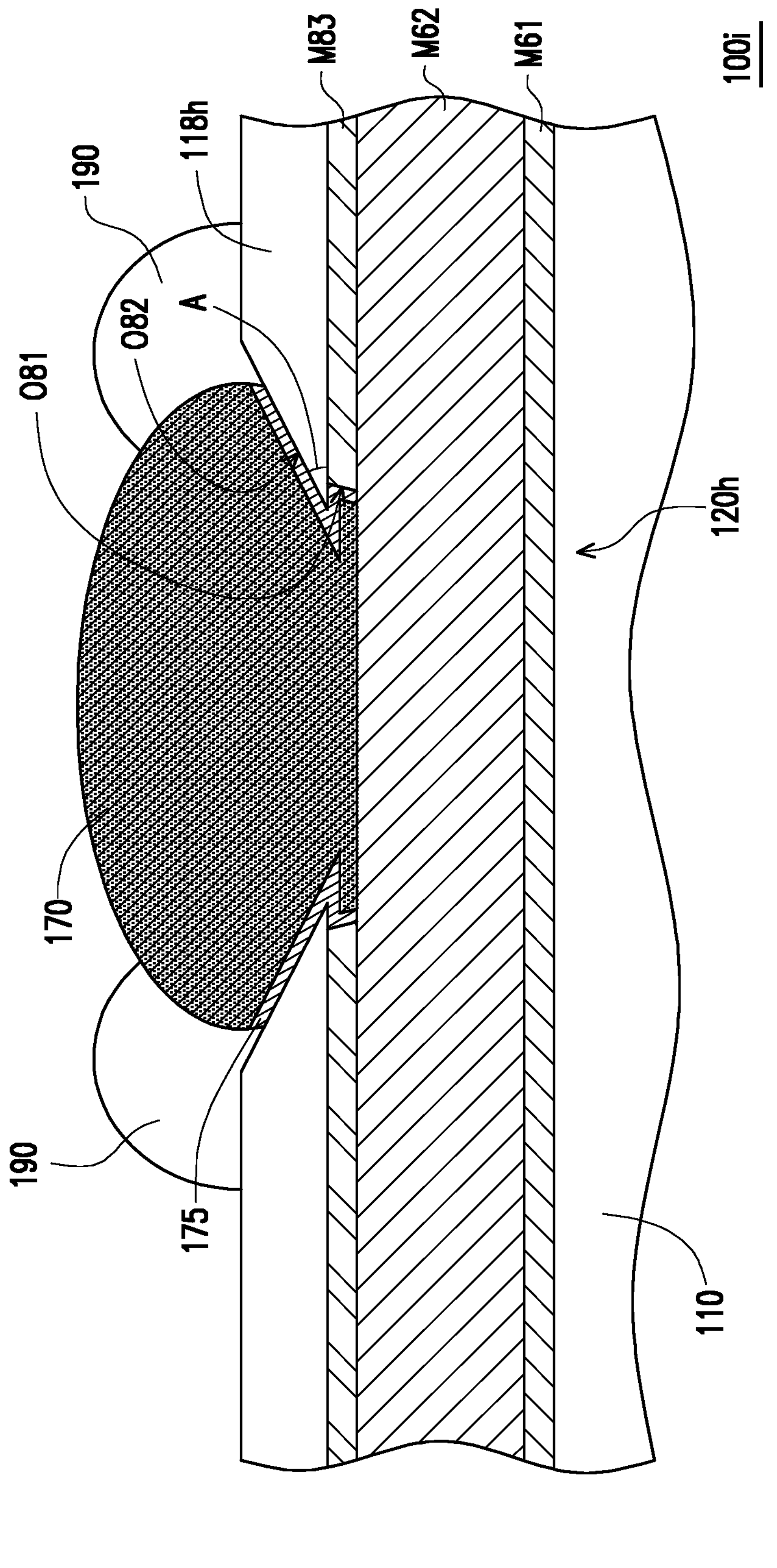
FIG. 9 is a partial cross-sectional schematic view of an electronic device according to another embodiment of the disclosure.

FIG. 9 is a partial cross-sectional schematic view of an electronic device according to another embodiment of the disclosure. Referring to FIG. 9, in the embodiment, an electronic device 100*i* further includes a blocking material 190 disposed between the solder 170 and the insulating layer 118*h*. The blocking material 190 can be, for example, a waterproof material, such as an organic compound like polyimide (PI), black photoresist, or an acrylic base material, covering part of the solder 170 and part of the insulating layer 118*h* adjacent to the solder 170, which can reduce the corrosion of the conductive composite structure 120*h* by moisture or oxygen.

In summary, in the embodiments of the disclosure, the conductive composite structure disposed on the substrate may include a first metal layer, a second metal layer, and a third metal layer. The thickness of the second metal layer located between the first metal layer and the third metal layer ranges from 0.5 μm to 12 μm. That is, the thicker second metal layer and the substrate are separated from the first metal layer, thereby effectively reducing the warpage of the second metal layer resulting from the difference in thermal expansion coefficient between the second metal layer and the substrate. Accordingly, the electronic device of the disclosure can have favorable structural reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising:

a substrate;

a first conductive composite structure and a second conductive composite structure disposed on the substrate, wherein the first conductive composite structure and the second conductive composite structure are disposed at intervals, the first conductive composite structure comprises a first metal layer, a second metal layer, and a third metal layer, the second conductive composite structure comprises an another first metal layer, an another second metal layer, and an another third metal layer, wherein the second metal layer is located between the first metal layer and the third metal layer, and a thickness of the second metal layer ranges from 0.5 μm to 12 μm;

an electronic element disposed on the first conductive composite structure and the second conductive composite structure and coupled to the first conductive composite structure and the second conductive composite structure;

an insulating layer disposed on the third metal layer, wherein the third metal layer comprises a first opening, and the insulating layer comprises a second opening, wherein the first opening exposes part of the second metal layer; and a first solder filled in the first opening and the second opening and electrically connected to the first conductive composite structure, wherein a thickness of the third metal layer ranges from 10 nm to 0.5 μm.

2. The electronic device according to claim 1, further comprising a second solder, wherein the first solder and the second solder are disposed between the electronic element and the substrate, the electronic element is electrically connected to the first conductive composite structure through the first solder and to the second conductive composite structure through the second solder.

3. The electronic device according to claim 1, further comprising a third conductive composite structure, the first conductive composite structure is located between the second conductive composite structure and the third conductive composite structure, and the first conductive composite structure, the second conductive composite structure, and the third conductive composite structure are separated from one another in a discontinuous manner.

4. The electronic device according to claim 3, wherein a horizontal distance between the first conductive composite structure and the second conductive composite structure and a horizontal distance between the first conductive composite structure and the third conductive composite structure range from 10 μm to 100 μm.

5. The electronic device according to claim 1, wherein the electronic element comprises an active electronic component, a passive electronic component, an integrated circuit or combination thereof.

6. The electronic device according to claim 1, further comprising:

a switching element and a redistribution layer disposed on the substrate, wherein the switching element is electrically connected to the first conductive composite structure or the second conductive composite structure through the redistribution layer.

7. The electronic device according to claim 1, wherein the third metal layer is at least partially in contact with a side surface of the second metal layer.

8. The electronic device according to claim 1, wherein a width of the first metal layer is less than or equal to a width of the second metal layer.

9. The electronic device according to claim 1, wherein part of a lower surface of the third metal layer is in contact with part of an upper surface of the first metal layer.

10. The electronic device according to claim 1, wherein the third metal layer is separated from the substrate by a distance, and the third metal layer covers a side surface of the second metal layer and part of the side surface of the first metal layer.

11. The electronic device according to claim 1, wherein a material of the first metal layer and a material of the third metal layer each comprise titanium, titanium alloy, molybdenum, molybdenum alloy, indium tin oxide, or oxide Indium zinc, and a material of the second metal layer comprises copper or aluminum.

12. The electronic device according to claim 1, wherein one of the first metal layer and the third metal layer comprises oxide.

13. The electronic device according to claim 1, wherein a thickness of the first metal layer ranges from 10 nm to 0.5 μm.

14. The electronic device according to claim 1, wherein a width of the first metal layer is greater than a width of the second metal layer.

15. The electronic device according to claim 1, wherein a material of the insulating layer comprises silicon nitride, silicon oxide, epoxy resin, silicon material, or a combination thereof.

16. The electronic device according to claim 1, further comprising:

a blocking material disposed between the first solder and the insulating layer.

17. The electronic device according to claim 16, wherein the blocking material comprises polyimide, black photoresist, or acrylic base material.

* * * * *